(12) United States Patent
Cavallini et al.

(10) Patent No.: US 8,497,719 B2
(45) Date of Patent: Jul. 30, 2013

(54) SLEW RATE PWM CONTROLLED CHARGE PUMP FOR LIMITED IN-RUSH CURRENT SWITCH DRIVING

(75) Inventors: Pier Cavallini, Swindon (GB);
Alessandro Angeli, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 37 days.

(21) Appl. No.: 13/136,143

(22) Filed: Jul. 25, 2011

(65) Prior Publication Data

US 2011/0279155 A1    Nov. 17, 2011

(30) Foreign Application Priority Data

Jul. 8, 2011    (EP) .................................... 11368022

(51) Int. Cl.
*H03K 5/12*    (2006.01)
(52) U.S. Cl.
USPC ........... 327/170; 327/172; 323/277; 323/288; 323/326
(58) Field of Classification Search
USPC ................. 323/277, 280, 282, 287, 288, 325, 323/326; 327/31, 35, 170–175
See application file for complete search history.

(56) References Cited

U.S. PATENT DOCUMENTS

| | | | |
|---|---|---|---|
| 5,481,178 A * | 1/1996 | Wilcox et al. | 323/287 |
| 5,689,394 A | 11/1997 | Esser et al. | |
| 5,773,966 A * | 6/1998 | Steigerwald | 323/284 |
| 6,107,862 A * | 8/2000 | Mukainakano et al. | 327/536 |
| 6,313,617 B1 | 11/2001 | Engelmann et al. | |
| 6,331,748 B1 * | 12/2001 | Hong | 310/318 |
| 6,738,272 B2 | 5/2004 | Yamanaka et al. | |
| 6,744,224 B2 | 6/2004 | Ishii | |
| 7,224,591 B2 | 5/2007 | Kaishita et al. | |
| 7,759,889 B2 * | 7/2010 | Hirata | 318/400.29 |
| 7,880,530 B2 | 2/2011 | Ishiyama | |
| 8,041,056 B2 * | 10/2011 | Kinoshita | 381/113 |
| 2005/0174815 A1 | 8/2005 | Chen et al. | |
| 2005/0231177 A1 | 10/2005 | Tateno et al. | |
| 2009/0072803 A1 | 3/2009 | Tiew et al. | |
| 2009/0309633 A1 | 12/2009 | Kotowski et al. | |
| 2010/0013548 A1 | 1/2010 | Barrow | |
| 2011/0127978 A1 * | 6/2011 | Lee et al. | 323/282 |

OTHER PUBLICATIONS

European Search Report—11368022.7-1233 Mail date—Feb. 24, 2012.

* cited by examiner

*Primary Examiner* — An Luu
(74) *Attorney, Agent, or Firm* — Saile Ackerman LLC; Stephen B. Ackerman

(57) ABSTRACT

Circuits and methods to limit an in-rush current of a load circuit such as a processor are disclosed. A charge pump is used as driver for switches with pulse modulation width (PWM) control on the duty cycle of a clock. A clock generator generates a ramp signal with variable slope and a reference voltage. The slope of the ramp signal is dependent on the in-rush current of the switch. No dedicated slew rate driver or an external capacitor is required. The main building blocks are: a charge pump used as driver connected to single supply domain, one external (or internal) switch device, a single capacitive feedback between the switch device and the PWM control, and a PWM control comprising a fix frequency voltage triangular pulse generator with variable slope proportional to the in-rush current measurement.

28 Claims, 4 Drawing Sheets

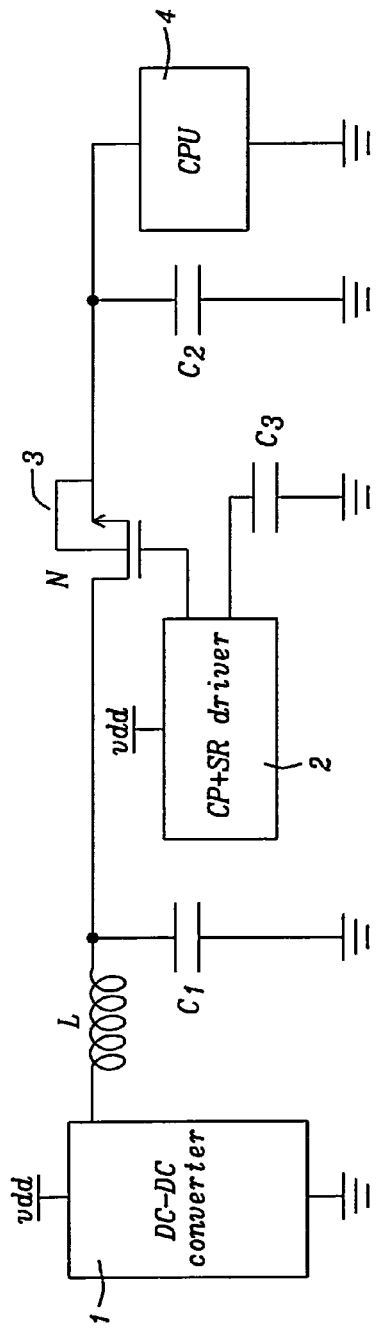
FIG. 1 – Prior Art
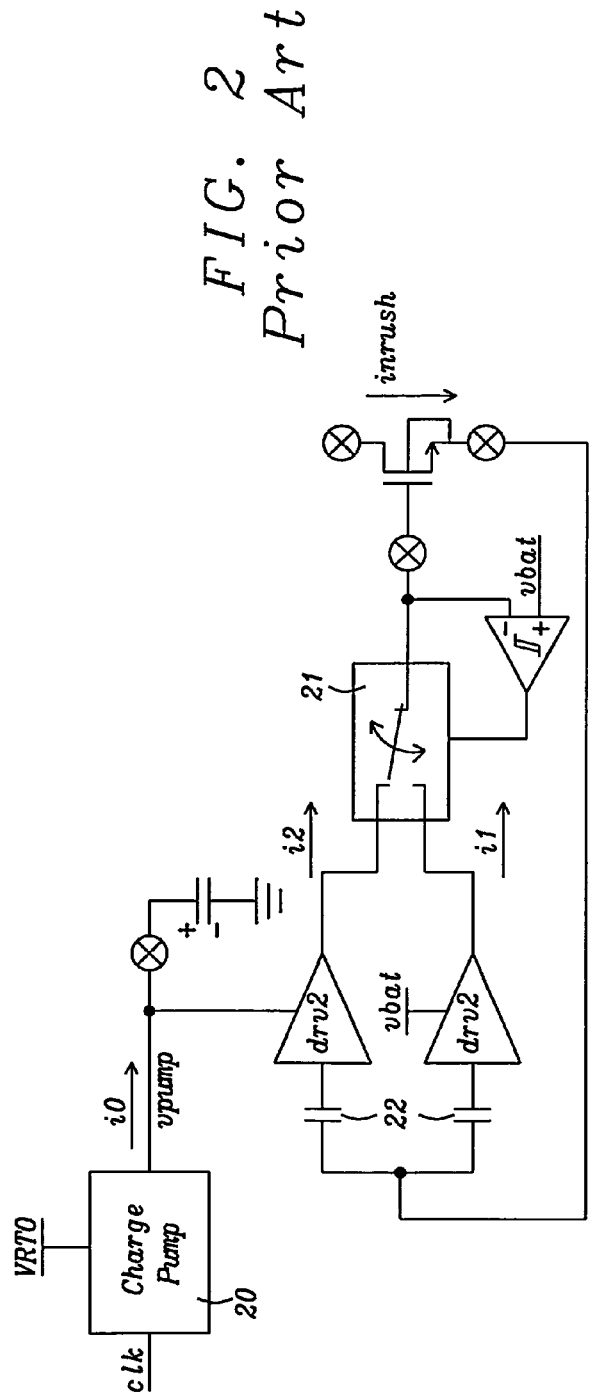
**FIG. 2
Prior Art**

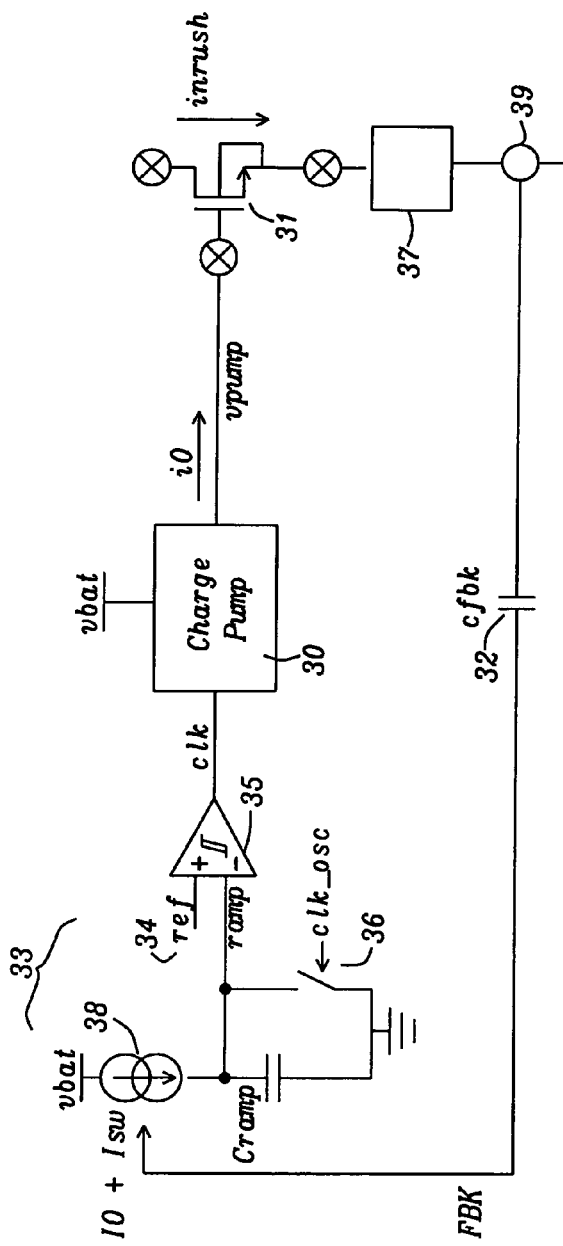
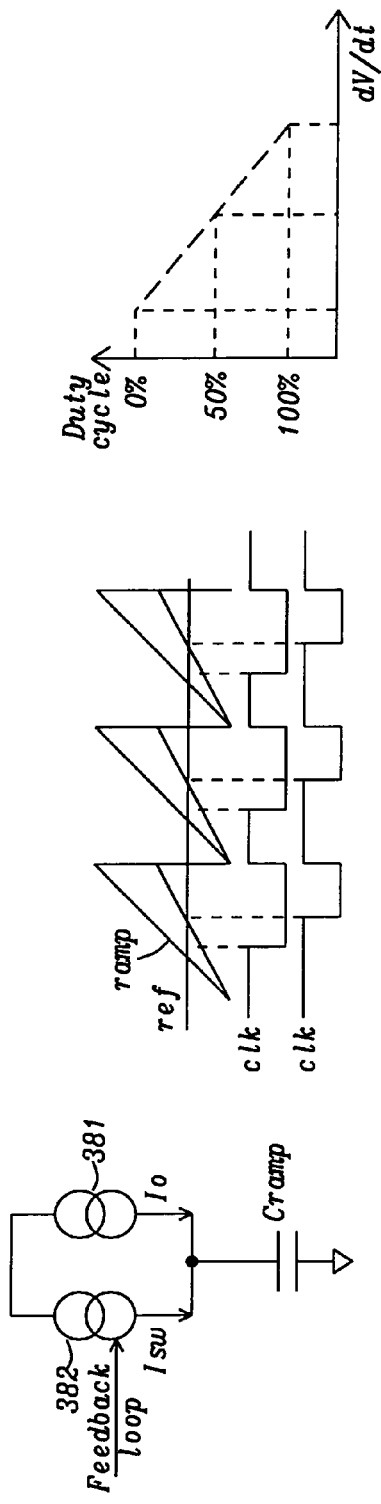
FIG. 3a
FIG. 3b
FIG. 4

SLEW RATE PWM CONTROLLED CHARGE PUMP FOR LIMITED IN-RUSH CURRENT SWITCH DRIVING

BACKGROUND (1) Field of the Invention

This invention relates generally to electronic charge pump driving and is specifically applied to a slew rate driver to avoid excessive in-rush current between a dc-dc converter and a load circuit during a turn-on process.

(2) Description of the Prior Art

During the development of power management solutions for mobile electronic devices, particular attention is required to reduce the battery consumption due to leakage of load circuits such as e.g. the CPUs. A common solution is the use of switches between a dc-dc converter and the load circuit (e.g. a processor). These switches isolate electrically the dc-dc converter from the load circuit and require:

- a slew rate controlled driver to avoid excessive in-rush current between the dc-dc converter and the load circuit during the turn-on process.
- a converter, such as a charge pump, able to supply the driver to a voltage above the battery level.

FIG. 1 prior art shows a power gating system architecture for such a solution comprising a DC-to-DC converter 1, a charge pump and a slew rate (SR) controlled driver 2, a transistor switch 3, an arrangement of capacitors C1-C3, and a load circuit (CPU) 4. Although this solution is very effective and allows multiple drivers to share the same charge pump, the continuous need of reducing the turn-on time of the switches requires a dramatic increase in the current delivered by the charge pump. A possible solution would be to increase either the size of the charge pump itself or the size of the external capacitor C3.

FIG. 2 prior art illustrates an alternative solution to limit the loading on the charge pump comprising of two drivers drv1 and drv2: drv1 supplied from the battery voltage Vbat and drv2 supplied from the charge pump 20 voltage Vpump. Drv1 is used to charge the switch gate 21 up to Vbat while drv2 is used only to raise the gate voltage from Vbat to Vpump. The in-rush current is controlled via capacitive feedback 22 with an internal capacitor to each driver. In summary solution shown in FIG. 2 prior art comprises one charge pump 20, two drivers drv1 and drv2, and one switch 21.

This approach requires further circuitry and complications to control the transition between voltage domains and to avoid glitches on the gate during the transition.

Furthermore when driver drv2 is active, the voltage drop occurring at the output of charge pump 20 translates into an increase of the resistance of the switch and so to a temporary increase of the power losses.

Although the solution is considered attractive in applications where is required to control multiple switches, it is very inefficient in terms of silicon area (two feedback capacitors and two drivers for each switch) therefore appears to be largely over dimensioned (in both on-chip and off-chip utilization) compared to solutions wherein only one switch is used.

It is a challenge for engineers to provide a method and circuit to avoid excessive in-rush current that do not have the disadvantages of the existing solutions.

There are known patents or patent publications dealing with limiting in-rush currents.

U.S. Patent Application (US 2010/0013548 to Barrow) discloses a charge pump, which uses a current limit resistor to limit in-rush current and peak currents. An additional advantage of such a charge pump is that, when being coupled to a boost converter or other switching converter utilizing an inductive energy storage element, it may avoid unnecessary power dissipation caused by the current limit resistor.

U.S. patent (U.S. Pat. No. 7,880,530 to Ishiyama) discloses a power supply circuit which boosts a given voltage to generate one or more power supply voltages including a charge-pump control circuit including switching elements for generating a boost voltage by a charge-pump operation using charge stored in a flying capacitor, a soft-start circuit which prevents a rush current toward the flying capacitor, and a power supply generation circuit which is connected with a stabilization capacitor and generates a power supply voltage using the boost voltage as a power supply. After the power supply generation circuit has been turned ON in a state in which the charge-pump control circuit generates the boost voltage by the charge-pump operation, the switching elements are turned OFF, and the soft-start circuit generates the boost voltage by a charge-pump operation.

U.S. Patent Application Publication (US 2006/0193156 to Kaishita et al.) proposes a charge pump DC/DC converter circuit including: a monitor circuit that detects a potential difference between terminals of a semiconductor switch that turns on during a first period, so as to output a determining signal corresponding to the potential difference; and each of drive circuits that outputs a drive signal to a semiconductor switch that turns on during a first period, in response to the determining signal. The drive signal increases the on-resistance of the semiconductor switch in proportion to the detected potential difference.

U.S. Patent Application Publication (US 2009/0309633 to Kotowski et al.) proposes a ramp-up circuit for switched capacitor circuits with negative feedback to control the slew rate of in-rush current and other embodiments.

U.S. patent (U.S. Pat. No. 6,738,272 to Yamanaka et al.) discloses a charge pump circuit, wherein a constant current circuit is disposed between an input power supply and an output capacitor. When a power supply is started to turn on, the operation of the charge pump circuit is stopped, and the output capacitor is charged up to a given voltage by the constant current circuit, and thereafter the normal operation of the charge pump is started to limit the rush current. When the power supply is started, the operation is conducted by an oscillator circuit having a small duty ratio, and thereafter the control is replaced by the PFM control having the normal duty ratio, to thereby reduce the rush current as compared with that of the conventional PFM control. When the power supply is started, a pre-driver including a current limiting element is used to drive a driver, resulting in such an advantage that the rush current is reduced as compared with that driven by the conventional pre-driver.

U.S. patent (U.S. Pat. No. 6,744,224 to Ishii) teaches an input voltage detecting circuit for detecting an input voltage provided inside a PFM control charge pump circuit, and potential differences between potentials appearing at gate terminals and potentials appearing at source terminals are reduced by gate voltage controlling circuits for in response to a signal from the input voltage detecting circuit, suppressing gate voltages of switch transistors of a charge pump to suppress a rush current value to thereby reduce a current to prevent generation of a noise.

SUMMARY

A principal object of the present invention is to use a charge pump as driver for switches with pulse modulation width (PWM) control on the duty cycle of the clock A further object of the invention is to reduce the number of external capacitors.

A further object of the invention is to reduce the on-chip area by embedding the slew rate driving capability inside the charge pump.

A further object of the present invention is to use a clock generator consisting on a ramp signal with variable slope and a reference voltage, wherein the slope of the ramp signal is dependent on the in-rush current of the switch.

Moreover an object of the invention is to achieve a simple solution with only one charge pump without requiring a dedicated slew rate control driver.

In accordance with the objects of this invention a method to limit the in-rush current of a load circuit has been achieved- The method comprises the following steps: (1) providing one charge pump only without requiring a dedicated slew rate driver, a switching means to direct a supply current a load circuit, a supply voltage, a PWM control of the charge pump comprising a fix frequency triangular pulse generator clock, and a means of feedback, (2) sensing a supply current of the load circuit, and (3) performing pulse-width modulation of a duty cycle of the pulse generator performing pulse-width modulation of a duty cycle of the pulse generator clock controlling the charge pump in order to limit the in-rush current to the load circuit, wherein a slope of a ramp signal generated by the pulse generator depends upon the supply current sensed.

In accordance with the objects of this invention a circuit for a slew rate PWM controlled charge pump for limited in-rush current switch driving has been achieved. The circuit invented comprises, firstly, a port for a main system supply voltage, a fix current source having a first terminal connected to the system supply voltage and a second terminal is connected to a PWM control block, and said variable current source, wherein the current generated depends on the in-rush current sensed via a feedback loop and wherein its second terminal is connected to the PWM control block. Furthermore the circuit comprises: said PWM control block controlling a duty cycle of a clock of a charge pump, said feedback loop, wherein its first terminal is receiving the in-rush current through a load circuit and its second terminal is controlling said variable current source, and said charge pump wherein its output is controlling a switching means. Finally the circuit comprises said switching means wherein a first terminal is connected to the system supply voltage and a second terminal supplies a current through a load circuit, and said load circuit.

BRIEF DESCRIPTION OF THE DRAWINGS

In the accompanying drawings forming a material part of this description, there is shown:

FIG. 1 prior art illustrates a solution using switches between a dc-dc converter and a CPU FIG. 2 prior art illustrates an alternative solution to limit the loading on the charge pump comprising of two drivers.

FIG. 3*a* illustrates a limited in-rush current driver architecture invented.

FIG. 3*b* shows in detail a fix current source and in parallel a current source wherein the current generated depends on an in-rush current sensed via a feedback loop.

FIG. 4 depicts the principles of operation of the PWM control of the present invention.

DESCRIPTION OF THE PREFERRED EMBODIMENTS

Figure 5:
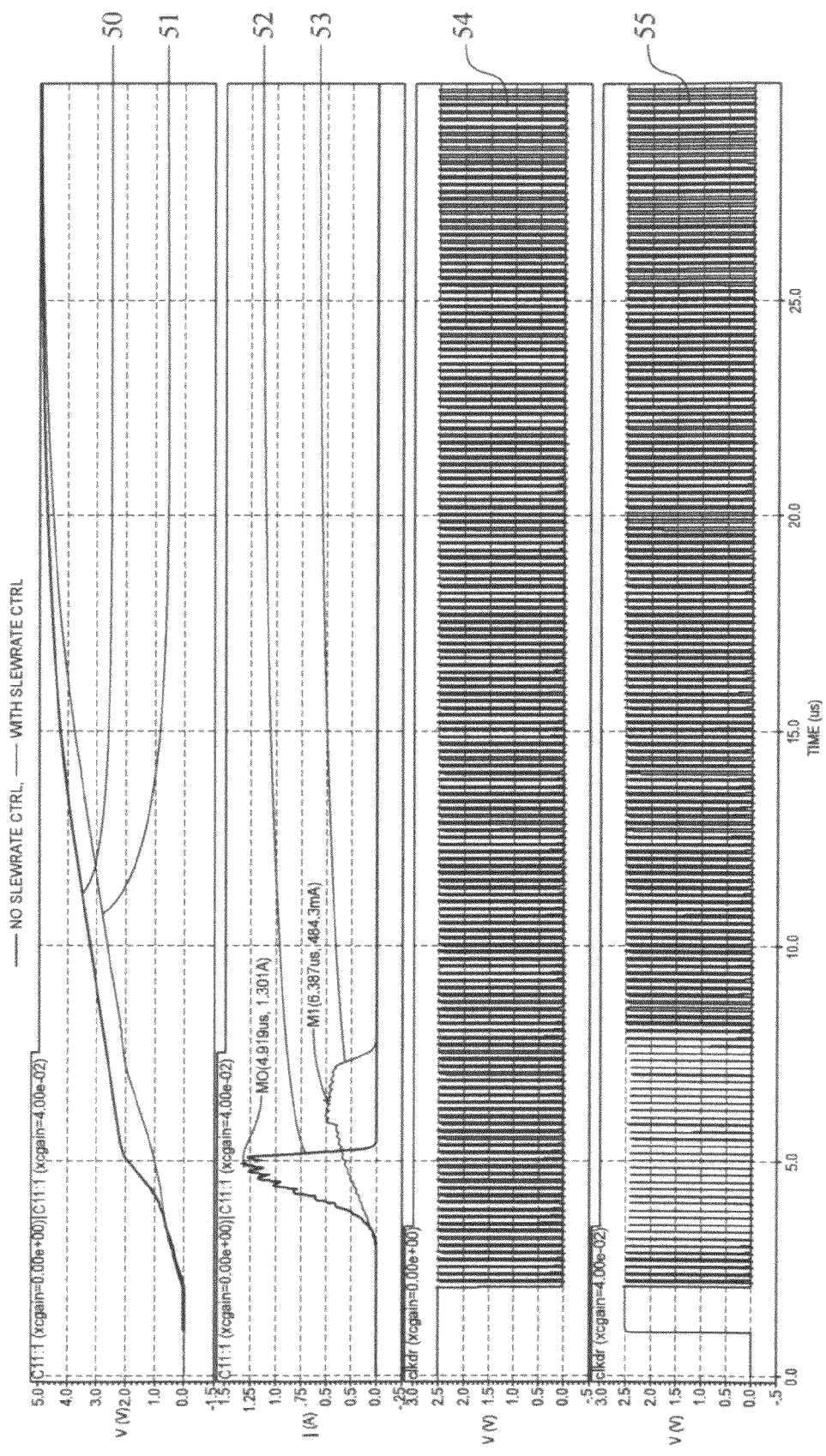
FIG. 5 shows simulations results on a model of the proposed invention.

Preferred embodiments of the invention disclose methods and circuits to limit in-rush currents of load circuits.

FIG. 3 illustrates a limited in-rush current driver architecture invented. The new architecture is characterized by providing a simple solution using one charge pump 30 as driver with feedback control on a clk duty cycle, wherein no external capacitor is required, i.e. 1 pin saved, and the area required is minimized. In this preferred embodiment a battery voltage Vbat is the main system supply voltage.

In the new proposed approach a charge pump 30 with slew rate control is used as driver and has a direct connection to a switch device 31.

The gate capacitance of the switch 31 (external in the preferred embodiment presented) represents the output capacitor to store the accumulated charge from the charge pump 30. Depending on a specific application this switch device 31 could also be internal if possible. A circuit load, 37, e.g. a processor, receives its supply current via the transistor switch 31. In the preferred embodiment the drain of the NMOS transistor switch 31 is connected to the output of a buck converter but generally it can be connected to any supply voltage including batteries.

A key innovation consists in the in-rush current limitation during turn-on and turn-off phases that is achieved through a pulse width modulation (PWM) of the duty cycle of the clock to the charge pump.

The principle of the instant invention works during both in turn on and off transients. When the charge pump has reached its maximum and the switch is fully on, the system (CPU) is completely connected to the supply (buck converter) and no current spikes should occur.

The main building blocks are as shown in FIG. 3*a* and FIG. 3*b*:

a charge pump 30 used as driver connected to single supply domain;
one external (or internal) switch device 31;
a single capacitive feedback 32 between the switch device and a pulse-width modulation (PWM) control 33;
a fixed 381 and a variable current source 382 in parallel the PWM control 33 comprising:
  a fix frequency voltage triangular pulse generator with variable slope proportional to the in-rush current measurement, wherein the pulse generator comprises a clk oscillator (not shown) and a capacitor Cramp; a switch 36 to reset a voltage a reference voltage 34 equivalent to the target value for the in-rush current;
  a short delay hysteretic comparator 35.

It should be noted that the principle of the instant invention would work with any kind of feedback. The capacitive feedback described in here is specific for the preferred embodiment of the invention and easy to implement despite the need of an extra external component. It works only in transients and it does not take any DC current between turn on/off periods.

Once the external switch is completely turned on, no further risks of in-rush currents are expected; therefore the preferred embodiment of the invention comprises disabling the current limiting system to save power between turn on/off periods.

The principles of operation of the PWM control 33 are illustrated in FIG. 4.

The on time of the clock signal depends on the slope of the ramp signal: the higher the current is flowing in the switch (highlighted), the steeper the slope of the ramp and therefore the shorter the on time of the clock.

Consequently the shorter the pulse, the smaller is the charge transferred to the gate of the switch device, which results finally in a limitation of the current in the switch.

The ramp generator has two contributions as shown in FIG. 3a and in detail in FIG. 3b:

- Io: a fix current source which defines the default slope of the ramp for 50% duty cycle condition when no current is sensed in the switch;
- Isw: a current source proportional to the in-rush current with programmable gain to superimpose the compensation ramp and perform the in-rush current limitation. The higher the current gain (Gi), the steeper the ramp for a certain sense current and the tighter the slew rate limitation.

FIG. 3b shows in detail illustrates the fix current source Io 381 and in parallel the current source Isw 382 wherein the current generated depends on an in-rush current sensed via a feedback loop.

The control on the duty cycle can be approximated as:

$$\text{duty cycle} = (\text{ref} \times \text{clk\_osc} \times \text{Cramp})/(Io + I\_\text{inrush} \times Gi)$$

where:
ref: is the reference voltage for the PWM comparator;
clk_osc: is the fix frequency clock;
Cramp: is the capacitor generating the correction ramp;
I_inrush: is proportional to the in-rush current.

Further advantages of this solution are:
- a single driver solution with linear charging of the gate from 0 to Vpump without complicated transitions between supply domains and related voltage drops;
- PWM control and total ramp-up time are independent from battery levels;
- Higher efficiency due to less dissipation paths represented by the absence of drivers in series to the charge pump;
- The charge pump needs to be enabled only when the switch needs to be activated.

It should be noted that the architecture of a preferred embodiment described above assumes that only one switch is connected at a given time, if more than one switch is connected, the solution is still valid providing that the switches are enabled at the same time.

FIG. 5 shows simulation results of the present invention.

Line 50 is a time curve illustrating the output voltage Vpump without applying a slew rate control. Line 51 is a time curve illustrating the output voltage Vpump applying the slew rate control of the present invention.

Line 52 is a time curve illustrating the supply current without applying a slew rate control. The maximum in-rush current in this case is 1.30 A. Line 53 is a time curve illustrating the supply current applying the slew rate control of the present invention. The maximum in-rush current in this case is 0.48 A. A reduction of 63% of the maximum in-rush current has been achieved by the slew-rate control of the present invention.

Line 54 is a time curve illustrating the clock pulses driving the charge pump without applying the slew rate control. Line 55 is a time curve illustrating the clock pulses driving the charge pump applying the slew rate control of the present invention. A comparison of both curves 54 and 55 shows clearly that the frequency of both pulses 54 and 55 is equal (fix frequency) but the pulse width of curve 55 is smaller than the pulse width of curve 54 during the turning of the load circuit. Therefore the maximum in-rush current is reduced as shown by the curves 52 and 53.

Figure 6:
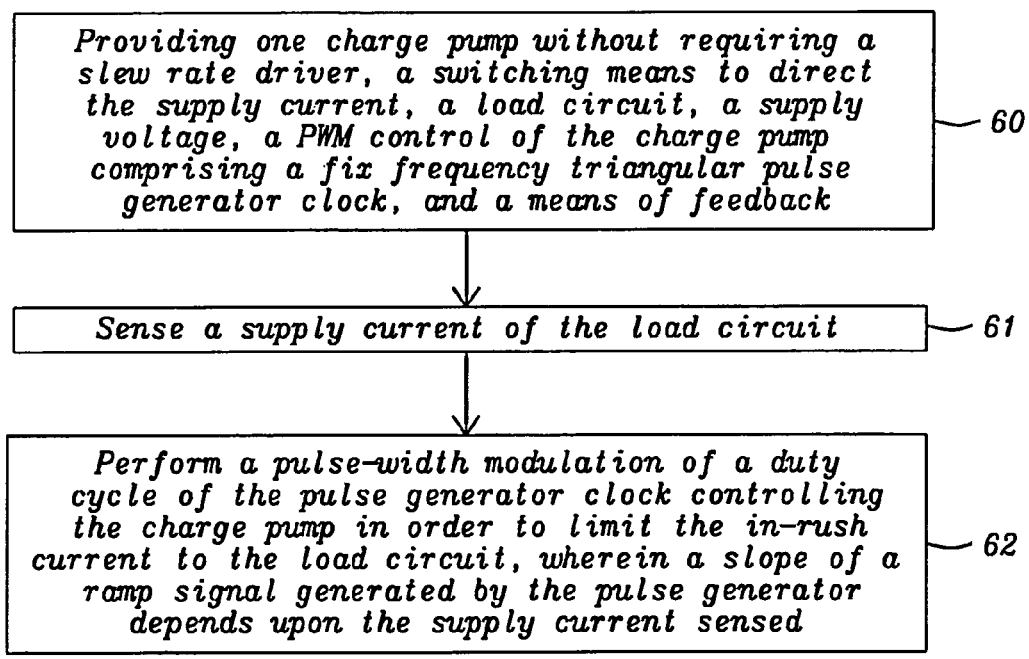
FIG. 6 illustrates a flowchart of a method invented to limit the in-rush current of a load circuit.

FIG. 6 illustrates a flowchart of a method invented to limit the in-rush current of a load circuit.

Step 60 of the method of FIG. 6 illustrates the provision one charge pump without requiring a slew rate driver, a switching means to direct a supply current a load circuit, a supply voltage, a PWM control of the charge pump comprising a fix frequency triangular pulse generator clock, and a means of feedback. Step 61 depicts sensing the supply current of the load circuit. The last step 62 illustrates performing pulse-width modulation of a duty cycle of the pulse generator clock controlling the charge pump in order to limit the in-rush current to the load circuit, wherein a slope of a ramp signal generated by the pulse generator depends upon the supply current sensed.

While the invention has been particularly shown and described with reference to the preferred embodiments thereof, it will be understood by those skilled in the art that various changes in form and details may be made without departing from the spirit and scope of the invention.

What is claimed is:

1. A method to limit the in-rush current of a load circuit, comprising the following steps:
   (1) providing one charge pump only with slew rate control, a switching means to direct a supply current to a load circuit, a supply voltage, a PWM control of the charge pump comprising a fix frequency triangular pulse generator clock, and a means of feedback;
   (2) sensing a supply current of the load circuit; and
   (3) performing pulse-width modulation of a duty cycle of the pulse generator performing pulse-width modulation of a duty cycle of the pulse generator clock controlling the charge pump in order to limit the in-rush current to the load circuit, wherein a slope of a ramp signal generated by the pulse generator depends upon the supply current sensed.

2. The method of claim 1 wherein said load circuit can be any load circuit.

3. The method of claim 1 wherein said load circuit is a processor.

4. The method of claim 1 wherein said switching means is a transistor switch.

5. The method of claim 4 wherein a gate capacitance of said transistor switch is used to store an accumulated charge from the charge pump.

6. The method of claim 4 wherein said transistor switch is deployed external of an IC in which the charge pump, the PWM control, and a means of feedback are integrated.

7. The method of claim 4 wherein said transistor switch is also integrated in the IC.

8. The method of claim 1 wherein no external capacitor is required.

9. The method of claim 1 wherein said means of feedback is a capacitive feedback.

10. The method of claim 9 wherein said capacitive feedback is a single capacitive feedback.

11. The method of claim 1 wherein said pulse generator generates fix frequency voltage triangular pulses with variable slope.

12. The method of claim 1 wherein said PWM control uses a reference voltage equivalent to a target value for the in-rush current.

13. The method of claim 12 wherein said reference voltage is a first input of a short delay hysteretic comparator.

14. The method of claim 1 wherein a ramp voltage of said pulse generator is a second input of hysteretic comparator.

15. The method of claim 1 wherein said pulse generator has a fix current contribution, which defines a default slope of the ramp for 50% duty cycle condition when no current is sensed in the switch.

16. The method of claim 1 wherein said pulse generator has a current source proportional to the in-rush current with programmable gain to superimpose a compensation ramp and perform the in-rush current limitation.

17. The method of claim 1 wherein the current limiting is disabled between turn-on and turn-off periods.

18. A circuit for a slew rate PWM controlled charge pump for limited in-rush current switch driving, comprising:
- a port for a main system supply voltage;
- a fix current source having a first terminal connected to the system supply voltage and a second terminal is connected to a PWM control block;
- a variable current source, wherein the current generated depends on an in-rush current sensed via a feedback loop and wherein its second terminal is connected to the PWM control block;
- said PWM control block controlling a duty cycle of a clock of a charge pump;
- said feedback loop, wherein its first terminal is receiving the in-rush current through a load circuit and its second terminal is controlling said variable current source;
- said charge pump wherein its output is controlling a switching means;
- said switching means wherein a first terminal is connected to a supply voltage and a second terminal supplies a current through the load circuit; and
- said load circuit.

19. The circuit of claim 18 wherein said feedback loop is a capacitive feedback loop.

20. The circuit of claim 18 wherein said PWM control block comprises:
- a fix frequency voltage triangular pulse generator with variable slope proportional to the in-rush current sensed via the feedback loop, wherein its output is connected to a second input of a comparator;
- a reference voltage equivalent to a target value for the in-rush current wherein the reference voltage is connected to a first input of the comparator; and
- said comparator wherein its output is providing clocking pulses for the charge pump.

21. The circuit of claim 20 wherein said comparator is a short delay hysteretic comparator.

22. The circuit of claim 20 wherein said pulse generator comprises:
- a capacitor, having a second terminal connected to ground and a first terminal connected to the second terminal of the variable and fix current sources, to the second input of the comparator, and to a first terminal of a clocking oscillator; and
- said clocking oscillator, wherein its second terminal is connected to ground.

23. The circuit of claim 18 wherein the charge pump is supplied by the main system supply voltage.

24. The circuit of claim 18 wherein the charge pump is supplied by any supply voltage available in the system.

25. The circuit of claim 18 wherein the main system supply voltage is a battery voltage.

26. The circuit of claim 18 wherein the main system supply voltage can be any supply voltage available in the system.

27. The circuit of claim 18 wherein said switching means is a transistor having its gate connected to the output of the charge pump, its drain is connected to the system supply voltage, and its source is connected a first terminal of the load circuit.

28. The circuit of claim 18 wherein said load circuit is a processor.

* * * * *